(12) United States Patent
Wong et al.

(10) Patent No.: US 6,657,933 B2
(45) Date of Patent: Dec. 2, 2003

(54) METHOD AND APPARATUS FOR READING AND WRITING A MULTILEVEL SIGNAL FROM AN OPTICAL DISC

(75) Inventors: Terrence L. Wong, San Francisco, CA (US); John L. Fan, Palo Alto, CA (US); David C. Lee, The Peak (HK); Yi Ling, Foster City, CA (US); Yung-Cheng Lo, San Leandro, CA (US); Steven W. McLaughlin, Decatur, GA (US); Laura L. McPheters, Austin, TX (US); Richard L. Martin, Berkeley, CA (US); Judith C. Powelson, Alameda, CA (US); Steven R. Spielman, Berkeley, CA (US); David K. Warland, Davis, CA (US); Jonathan A. Zingman, Oakland, CA (US)

(73) Assignee: Calimetrics, Inc., Alameda, CA (US)

( * ) Notice: Subject to any disclaimer, the term of this patent is extended or adjusted under 35 U.S.C. 154(b) by 0 days.

(21) Appl. No.: 09/910,464

(22) Filed: Jul. 19, 2001

(65) Prior Publication Data

US 2002/0034138 A1 Mar. 21, 2002

Related U.S. Application Data

(63) Continuation of application No. 09/253,808, filed on Feb. 18, 1999, now Pat. No. 6,275,458.

(51) Int. Cl.⁷ .................................................. G11B 5/09
(52) U.S. Cl. ................................ 369/47.35; 369/47.25; 369/59.15
(58) Field of Search ........................... 369/47.19, 47.25, 369/59.15, 59.22, 124.1, 47.15, 47.17, 47.35, 59.21

(56) References Cited

U.S. PATENT DOCUMENTS

| | | | |
|---|---|---|---|
| 5,136,573 A | 8/1992 | Kobayashi | 369/116 |
| 5,144,615 A | 9/1992 | Kobayashi | 369/116 |
| 5,148,335 A | 9/1992 | Kudo et al. | |
| 5,537,382 A | 7/1996 | McLaughlin et al. | 369/116 |
| 5,719,843 A * | 2/1998 | Nakajima et al. | 369/59.22 |

OTHER PUBLICATIONS

Coombs, J.H., et al, "Laser-induced crystallization phenomena in GeTe based alloys", J. Appl. Phys. 78(8), Oct. 15, 1995, pp. 4906–4917.

Parker, Dana J., "The Many Faces of High Density", *EMEDIA Professional*, Jan. 1998, pp. 60–71; http://www.onlineinc.com/emedia.

* cited by examiner

Primary Examiner—Paul W. Huber
(74) Attorney, Agent, or Firm—Van Pelt & Yi LLP

(57) ABSTRACT

A system and method are disclosed for reading a multilevel signal from an optical disc. The method includes reading a raw analog data signal from a disc using an optical detector and adjusting the amplitude of the raw analog data signal. A timing signal is recovered from the amplitude adjusted analog data signal and correction is made for amplitude modulation of the raw analog data signal by processing the raw analog data signal and the timing signal.

14 Claims, 7 Drawing Sheets

Preamble format a address
b Erc data synch
c timing fields
d AGC
e DC
f ECC
g data
h trellis cleanup Data block/ECC format a d g b c g e g c g e g c g e f d g b h c c timing fields
g filler data
h trellis cleanup
e DC control
d AGC fields Postamble format c g h e c g h e c g h e d g

METHOD AND APPARATUS FOR READING AND WRITING A MULTILEVEL SIGNAL FROM AN OPTICAL DISC

This application is a continuation of U.S. Ser. No. 09/253,808, filed Feb. 18, 1999, now U.S. Pat. No. 6,275,458.

BACKGROUND OF THE INVENTION

1. Field of the Invention

The present invention relates generally to a method and apparatus for reading multilevel signals from an optical disc and writing multilevel signals to an optical disc. The invention relates to methods and apparatuses for processing signals that are eventually written to and read from an optical disc. These signals produce marks on the optical disc that may vary in both reflectivity and length. The system disclosed provides a method of encoding and decoding the data, correcting for errors, synchronizing the data, controlling the DC content, establishing and recovering a clock signal, establishing and recovering the envelope of the signal, and compensating for signal distortion.

2. Relationship to the Art

In order to increase the capacity and speed of optical data storage systems, multilevel optical recording systems have been developed. It should be noted that in this specification, the term multilevel is used to indicate greater than 2 levels. In a traditional optical recording system, reflectivity of the recording media is modulated between two states. The density of data recorded on an optical recording medium may be increased by modulating the reflectivity of the optical recording medium into more than two states.

One type of optical recording medium that appears to be particularly suitable for multilevel signal modulation is phase change optical material. When a phase change material is heated by a writing laser, the reflectivity of the phase change material may be changed. The change in reflectivity may be controlled by adjusting the amount of heating of the material and the rate at which the material cools. This process is described further in "Laser-induced crystallization phenomena in GeTe-based alloys. I. Characterization on nucleation and growth" (J. Appl. Phys. 78 (8), Oct. 15, 1995. p. 4906) by J. H. Coombs, et. al. (hereinafter "Coombs").

After a phase change optical disc has been written, the intensity of a beam of light reflected from the disc is measured so that the multilevel data written to the disc may be recovered. U.S. Pat. No. 5,144,615 entitled APPARATUS AND METHOD FOR RECORDING AND REPRODUCING MULTILEVEL INFORMATION issued to Kobayashi (hereinafter "Kobayashi") discloses a system for recovering multilevel data from such an optical disc. FIG. 1 is a block diagram illustrating the system disclosed in Kobayashi for recovering such data. Analog data read from a detector is input from a mark length detecting circuit 101 and a reflectivity detecting circuit 102. The outputs of these circuits are sent to an analog-to-digital (A/D) converter 103. The A/D converter 103 includes an n-value circuit which determines the value that the signal corresponds to by comparing the signal to predetermined reference voltages. Subsequently, the n-value signal is converted into a binary signal by binary circuit 405.

While this system discloses the concept of reading a multilevel signal and converting it into a digital signal in a basic sense, no method is disclosed of handling various imperfections in optically read multilevel signals that in fact tend to occur. For example, it is not clear how a clock is recovered for the purpose of precisely detecting mark lengths and no method is disclosed for handling problems that tend to occur in real systems such as amplitude modulation and DC offset of the optically detected signal and noise.

In a conventional two level optical data storage system, information is stored in the lengths of the marks and the spaces between them. So long as the edge of a mark can be detected with enough precision to distinguish between marks that differ in length by a minimum allowed amount, the system can operate reliably. This edge transition between one reflectivity state and another can be detected by setting a threshold value and determining the time when the signal crosses the threshold. Slow amplitude variations that might interfere with this edge detection are removed by AC coupling the photodetector signal before the threshold detection circuit. Mark and space lengths are measured by counting how many clock periods are between the edge transitions. The reader clock periods are synchronized to the mark/space edges, thus ensuring that there are an integral number of clock periods in each mark/space.

In contrast, in a multilevel recording system, it is the amplitude of the signal that carries information. The reader must interpret the data signal to determine the amplitude of the signal at certain times. Therefore, the reader clock must be synchronized to the data stream to ensure that the reader is interpreting the signal at the proper time. Because of the blurring effect of the optics in a reader, the transitions between the different levels do not create sharp edges. It is therefore difficult to synchronize the reader clock to the data stream. A method of precisely aligning a read data stream is needed. Further, a multilevel system is more sensitive to fluctuations in the overall envelope of the data signal. AC coupling alone is not adequate to enable a sufficiently precise determination of the different amplitude signals. Another problem encountered in a multilevel optical disc system is DC compensation.

In order for a multilevel optical read system to reliably record and recover data, a method of handling these sources of error in reading an optical signal is needed.

SUMMARY OF THE INVENTION

Accordingly, a system for writing and reading multilevel marks on an optical disc is disclosed. The system includes an error correction encoding and decoding system, modulation and demodulation system, DC control system, amplitude correction circuit, a clock recovery circuit, a write strategy system, a system to focus and track the laser spot on the surface of the disc, a system to rotate the disc, and an interface to a computer system. It should be appreciated that the present invention can be implemented in numerous ways, including as a process, an apparatus, a system, a device, a method, or a computer readable medium that includes certain types of marks that enable reliable data storage and recovery. Several inventive embodiments of the present invention are described below.

In one embodiment, method is disclosed for reading a multilevel signal from an optical disc. The method includes reading a raw analog data signal from a disc using an optical detector and adjusting the amplitude of the raw analog data signal. A timing signal is recovered from the amplitude adjusted analog data signal and correction is made for amplitude modulation of the raw analog data signal by processing the raw analog data signal and the timing signal.

In another embodiment, a method of reading a multilevel signal from an optical disc includes reading a raw analog data signal from a disc using an optical detector and recovering a timing signal from the raw analog data signal. The analog signal is converted to a digital data signal using an A/D converter. Amplitude modulation of the raw analog data signal is corrected by processing the digital data signal to obtain an amplitude adjusted digital data signal.

In another embodiment, a method of reading a multilevel signal from an optical disc includes reading a raw analog data signal from a disc using an optical detector and correcting for amplitude modulation of the raw analog data signal by processing the raw analog data signal to obtain an amplitude adjusted analog data signal. A timing signal is recovered from the amplitude adjusted analog data signal and the timing signal is used to further correct for amplitude modulation in the amplitude adjusted analog data signal.

In another embodiment, A method of reading a multilevel signal from an optical disc includes reading a raw analog data signal from a disc using an optical detector and correcting for amplitude modulation of the raw analog data signal by processing the raw analog data signal to obtain an amplitude adjusted analog data signal. A timing signal is recovered from the amplitude adjusted analog data signal. The amplitude adjusted analog data signal is converted to a digital data signal. The digital data signal is processed with a fractionally spaced equalizer to obtain an equalized data signal.

In another embodiment, a method of reading a signal from an optical disc includes reading a raw analog data signal from a disc using an optical detector. The raw analog data signal includes an alignment sequence. The alignment sequence is chosen such that the autocorrelation of the alignment sequence has a substantially high value at a single alignment point. The raw analog data signal is converted to a digital data signal. The digital data signal is cross correlated with a stored digital version of the alignment sequence so that the start of a data sequence can be determined.

In another embodiment, a multilevel pattern of marks written to an optical disc includes a preamble and a data block. The preamble includes a timing acquisition sequence of fields, an alignment sequence, a calibration sequence of marks, and an equalizer training section.

In another embodiment, A multilevel pattern of marks written to an optical disc organized into an ECC block includes modulation encoded marks and physical format marks. The modulation encoded marks include an encoded address section and encoded data marks. The physical format block marks include periodic ECC data synch fields, periodic timing fields, periodic AGC fields, and periodic DC control fields.

In another embodiment, a method of recording data on an optical disc includes defining a desired data sequence and deriving a write signal from the desired data sequence using a write strategy. The optical disc is recorded using the write signal and the optical disc is read to obtain a recovered sequence. The recovered sequence is compared to the desired data sequence and the write strategy is adjusted based on the comparison of the recovered sequence to the desired data sequence so that the recovered sequence tends to converge toward the desired data sequence.

In another embodiment, a method of recording data on an optical disc includes defining a desired data sequence and deriving a write signal from the desired data sequence using a write strategy. The optical disc is recorded using the write signal and the optical disc is read to obtain a recovered sequence. The desired data sequence is linearly filtered. The recovered sequence is compared to the linearly filtered desired data sequence and the write strategy is adjusted based on the comparison of the recovered sequence to the linearly filtered desired data sequence so that the recovered sequence tends to converge toward the linearly filtered desired data sequence.

In another embodiment, a multilevel pattern of marks written to an optical disc includes data marks that include more than two levels of data, timing fields occurring periodically between the data marks, and automatic gain control fields occurring periodically between the data marks wherein the automatic gain control fields correspond to a specific level of data.

In another embodiment, a method of writing a multilevel signal to an optical disc includes encoding data by mapping the data onto a plurality of levels including more than two levels, adding synchronization fields to the encoded data, determining a DC level of the encoded data, and adding DC control fields to keep the DC level of the encoded data substantially constant.

In another embodiment, a method of writing a multilevel signal to an optical disc includes determining a raw data sequence having raw data sequence elements and encoding the raw data sequence using a convolutional code to obtain a correlated data sequence. The correlated data sequence has correlated data sequence elements that are a function of more than one element of the raw data sequence. The correlated data sequence is written to the optical disc.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment.

On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
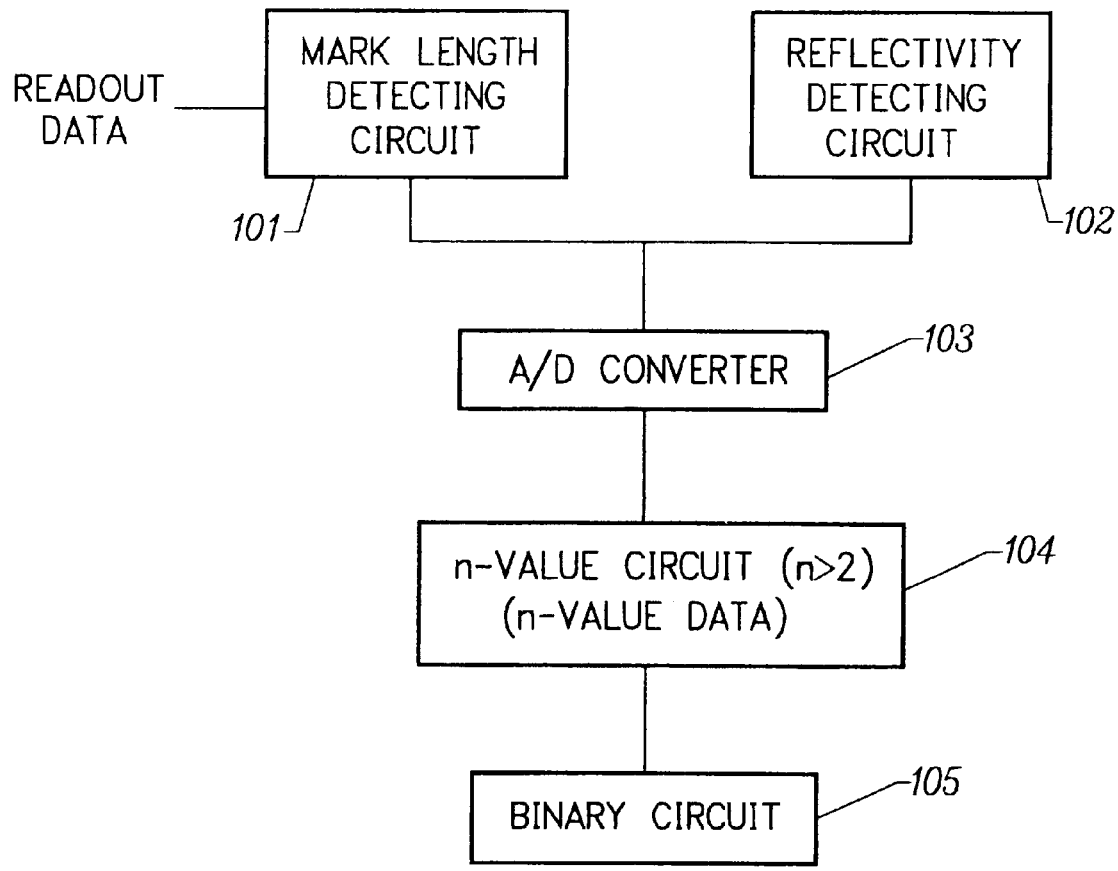
FIG. 1 is a block diagram illustrating the system disclosed in Kobayashi for recovering such data.
Figure 2:
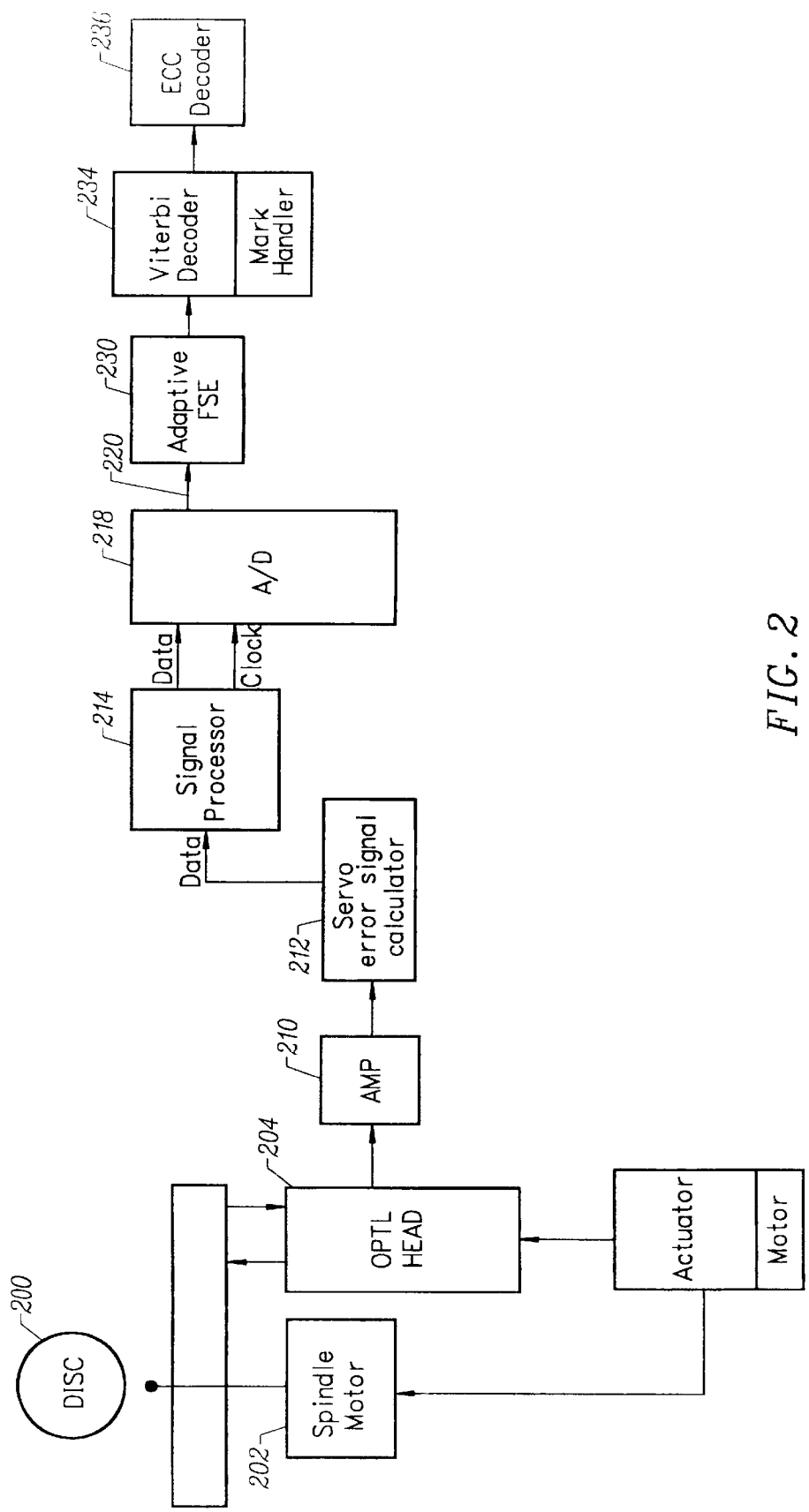
FIG. 2 is a block diagram of a system for reading a multilevel signal from an optical disc.

FIG. 2 is a block diagram of a system for reading a multilevel signal from an optical disc. A disc 200 is rotated by a motor 202. An optical head 204 includes a laser that illuminates a storage location on the disc and a multi-element photodetector that detects the reflected light from the location. The optical disc contains a multilevel modulated signal. The multilevel signal may be written to the optical disc in different embodiments using various techniques for changing the reflectivity of the disc including varying pit depth, varying the exposure of a dye, or changing the phase of an optical phase change material. In the example illustrated below, an optical phase change material is used. The photodetector converts the light into an electrical signal which is converted from a current to a voltage and amplified by an pre-amplifier 210. The output of the pre-amplifier 210 is fed to a servo error-signal calculator 212 that calculates combinations of the signal for the focus, tracking, and data interpretation systems. The data signal contains the multilevel information and in prior art systems such as the one described above, the amplified data is input into an A/D converter for the purpose of digitizing that information. An improved system is disclosed herein that includes various signal processing stages between the amplifier and the A/D converter as well as after the A/D converter.

The signal from servo error-signal calculator 212 is input to a signal processing system 214 before it is input into an analog to digital (A/D) converter 218. The signal processing system 214 is further described in FIG. 3. In addition to the processed data signal, a clock signal is generated by signal processing system 214 and the clock signal is also provided to A/D converter 218. The digitized output signal from the A/D converter 220 is input into an adaptive fractionally spaced equalizer (FSE) 230. This adaptive FSE shapes the frequency response of the data signal so that the data channel collectively gives a specific amount of intersymbol interference. In addition, the adaptive nature of the FSE allows the system to accommodate interchange of media and players and inhomogeneities in the media. The output of the adaptive FSE is input into a Viterbi decoder 234 that includes a mark handler.

The mark handler is used to separate special timing and gain control fields, DC control fields, and other fields that do not carry data from storage locations on the disc that actually represent data. Timing and gain control fields are described below. DC control fields are periodically written to the disc to adjust the average signal level written to the disc so that low frequency content of the signal is suppressed. These DC control fields do not carry information and are used simply to avoid having a DC bias on the read signal.

The Viterbi decoder recovers the sequence of data encoded on the disc. The output of the Viterbi decoder is input to an error correction code decoder 236 and the output data from the error correction code decoder is made available to the system reading data from the optical disc.

Figure 3A:
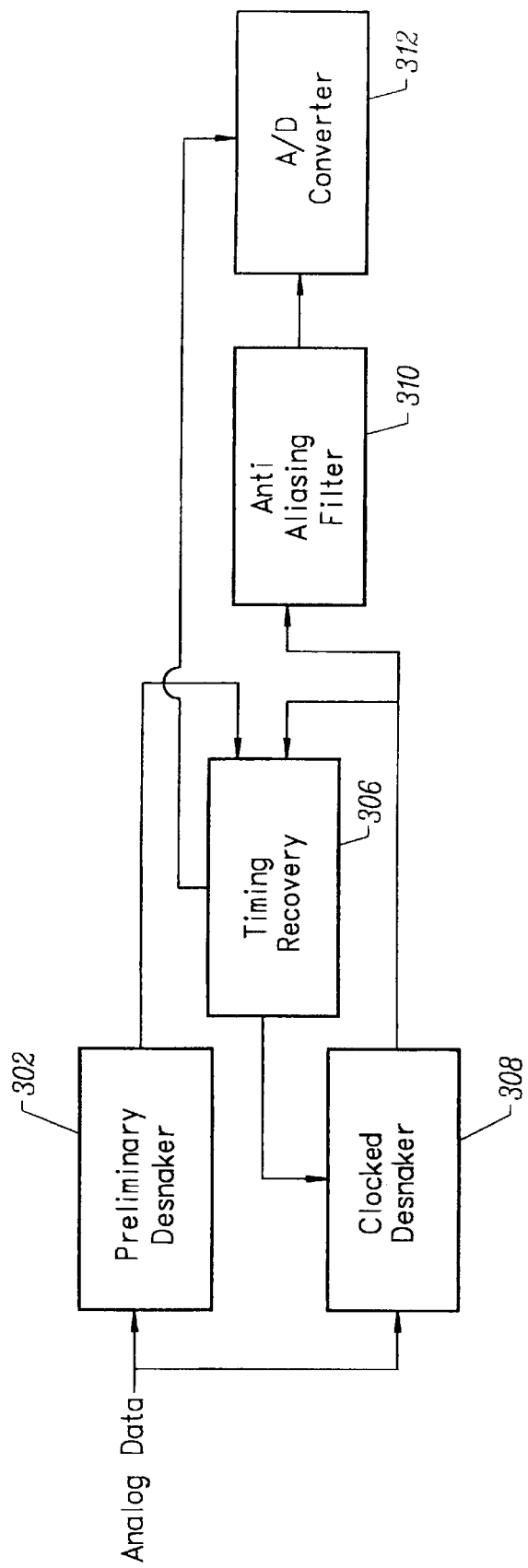
FIG. 3A is a block diagram illustrating the components of a signal processing system.

FIG. 3A is a block diagram illustrating a desnaker that may be included in the components of signal processing system 214. An analog signal is fed into a preliminary desnaker 302 and also to a clocked desnaker 308. The purpose of the desnaker is to remove the effect of amplitude modulation on the signal. The desnaker removes modulation in the envelope of the signal caused by variations in the characteristics of the optical disc or mechanical variations. For example, disc warp may cause amplitude modulation of the read signal separate from the recorded data. Also, the amount of phase change optical material deposited may vary, or there may be variations in the index of refraction or the thickness of the polycarbonate material covering the surface of the disc. These variations in the envelope of the data signal cause data read errors as well as timing errors.

Figure 4:
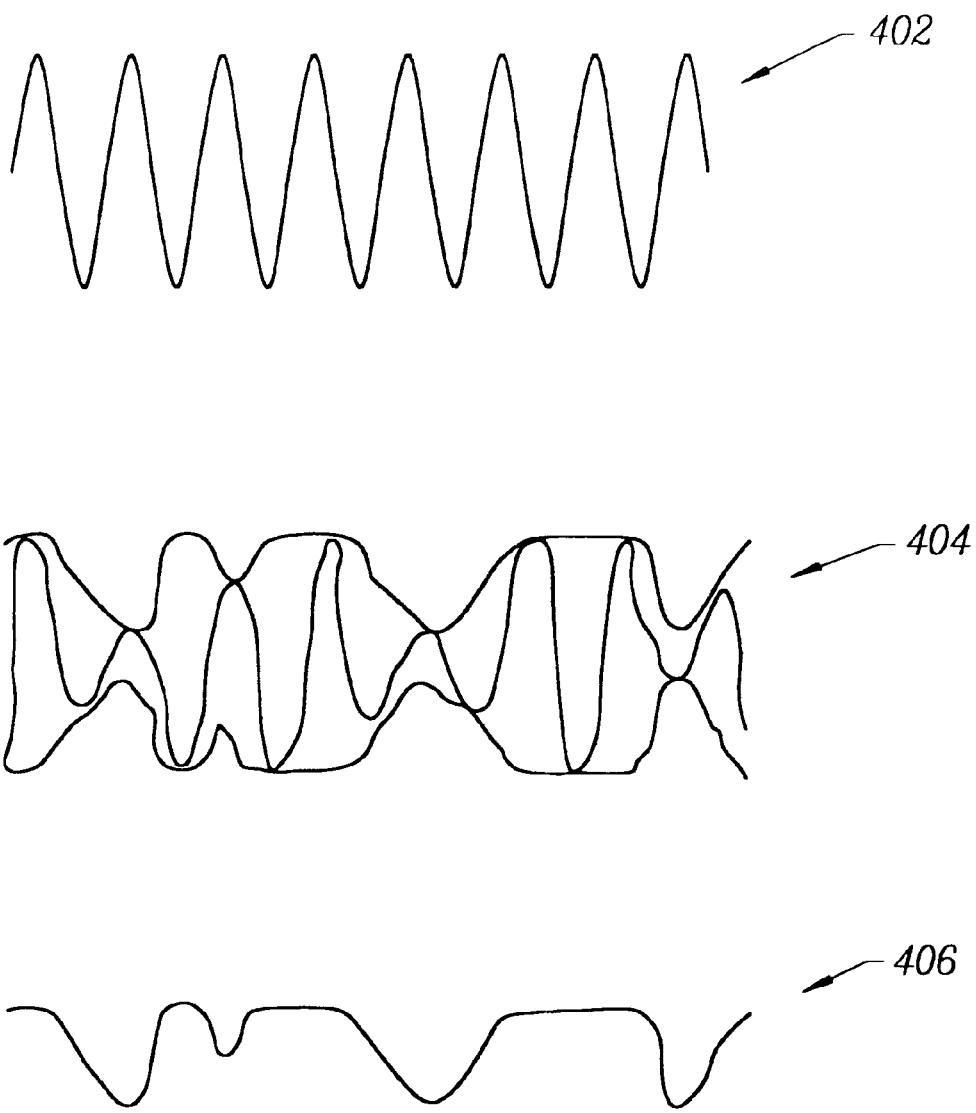
FIG. 4 illustrates how the preliminary desnaker processes an amplitude modulated signal.

FIG. 4 illustrates how the preliminary desnaker processes an amplitude modulated signal. The desired signal 402 does not have variation in its envelope. A raw signal 404 typically has some variation in its envelope. This varying envelope resembles the shape of a snake, hence the term "desnaking". In one embodiment, the envelope variation is removed by using top and bottom envelope detector circuits. The output of a top envelope detector circuit applied to amplitude modulated signal 404 is shown as signal 406. Signal 406 follows the peaks of the raw signal. Similarly, the output of a bottom envelope detector circuit follows the minimums of the raw signal.

The top and bottom envelope detection circuit outputs are used to normalize the amplitude. The amplitude modulation is removed by subtracting off the bottom signal from the data signal and then dividing by top minus bottom. In other words, the offset is subtracted off of the data signal, and then the amplitude is normalized. The design of peak detectors is described in *The Art of Electronics* by Horowitz and Hill which is herein incorporated by reference.

The output of preliminary desnaker 302 is input into a timing recovery system 306 for the acquisition of timing fields. Timing recovery circuit 306 acquires synchronization to timing fields that are included in the data signal and generates a sample clock. In one embodiment, a timing field includes a series of storage locations, or marks, written with specific values. Specifically, a timing field can include three storage locations written at the highest mark signal level followed by three storage locations written at the lowest mark signal level. In other embodiments, timing recovery can also be achieved by synchronizing to the data marks without specific timing fields being embedded in the data signal.

A timing field may also be three storage locations written at the lowest level followed by three storage locations written at the highest level. The difference between the high to low transition timing fields and the low to high transition timing fields is used to distinguish the fields. In addition, in one embodiment, every fourth timing field is five storage positions written at the highest level followed by five storage positions written at the lowest level or five storage positions written at the lowest followed by five storage positions written at the highest level. The extra long timing field that is ten storage positions long is also used as an amplitude automatic gain control field. The automatic gain control fields are used to more accurately desnake or remove the amplitude modulation of the envelope of the data signal.

Once the clock recovery circuit has locked to the timing fields, the clocked desnaker is used to more accurately desnake the signal. The clocked desnaker 308 receives an input from the timing recovery circuit and also receives the raw data signal from the optical detector. The clock desnaker 308 performs a more accurate removal of the amplitude modulation on the signal because the clocked desnaker uses the clock signal recovered by the clock recovery circuit to determine a point near the center of either a high region or low region of the automatic gain control field. Such a point gives a reliable measure of the full amplitude response of the media at that location, since intersymbol interference from neighboring marks of different levels is reduced or eliminated. Amplitude modulation of the signal is removed again by subtracting off the offset of the signal and by multiplying the signal by a value that is inversely proportional to the amplitude detected. Other methods of correcting for the amplitude modulation may be used that use the signal read from the automatic gain control field.

Thus, the amplitude modulation is initially removed using a preliminary desnaker and the output of the preliminary desnaker is used to acquire a clock signal. Once the clock signal is acquired, the clock signal is used to locate portions of the raw data signal that include automatic gain control (AGC) fields. The signal read at the automatic gain control field locations is used to more precisely compensate for amplitude modulation that occurs on the disc. The more precise compensation is performed by the clocked desnaker, and the output of the clocked desnaker is then used by the system.

The clocked desnaker uses the timing information obtained by the clock recovery circuit to accurately desnake the signal based on the signal read at the positions of the automatic gain control fields. This arrangement of a preliminary desnaker that facilitates the clock recovery and a second desnaker using the signal obtained from automatic gain control fields yields particularly good results. In other embodiments, different desnaking systems are used.

In one embodiment, a first preliminary desnaker is used that is similar to the preliminary desnaker described above. However, instead of a second clocked desnaker that operates on the read analog signal, the read analog signal is digitized and a digital desnaker is used to precisely desnake the data. In such an embodiment, the number of bits of resolution of the digitized read signal exceeds the number of bits of data that are encoded in the signal. In other embodiments, the raw analog signal is digitized without analog desnaking and all desnaking occurs in the digital domain.

Referring back to FIG. 3A, the signal output from the clocked desnaker is input into an anti-aliasing filter 310 and the output of the anti-aliasing filter 310 is input to an analog to digital (A/D) converter 312. A clock signal from the timing recovery system is also input to the analog to digital converter. The clock signal is used by the A/D converter to determine when to digitize the data signal. This digitized signal is then fed to FSE 230 shown in FIG. 2. It has been discovered that the analog desnaking prior to digitization may significantly improve system performance in some cases. In an alternate embodiment, the data signal is digitized by the A/D converter with only the preliminary desnaker or with no desnaking. This signal is then desnaked in the digital domain using a similar algorithm based on the measurement of the automatic gain control field signal levels.

Figure 3B:
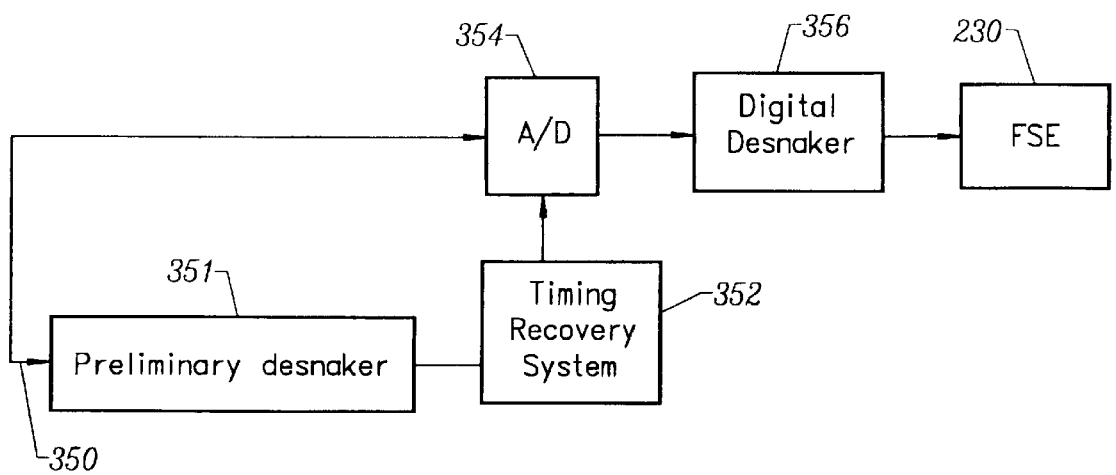
FIG. 3B is a block diagram illustrating an alternative desnaking architecture.

FIG. 3B is a block diagram illustrating an alternative desnaking architecture. A read signal 350 is input to a preliminary desnaker 351. Timing information is derived from the output of the preliminary desnaker by a timing recovery system 352 and the timing information is used to generate a clock for an analog to digital converter 354, which digitizes the read signal. The output of analog to digital converter 354 is input to a digital desnaker 356 that processes the signal to perform desnaking in the digital domain. Desnaking is performed digitally by analyzing recovered signal peak values and making adjustments to the signal to correct for detected signal amplitude variation. As in the clocked analog desnaker, automatic gain control marks may be used. The output of analog to digital converter 354 is input to FSE 230. In one embodiment, the analog to digital converter is a 12 bit analog to digital converter and the FSE derives 8 levels of data.

In one embodiment, FSE is a finite impulse response (FIR) filter with two taps for each mark. The equalizer is designed to shape the response of the channel to a specific equalization target. In one embodiment, the equalization target has a 1+D target transfer function. That is, the target output signal after passing through the optical data channel and equalization is equal to the input signal plus the input signal delayed by a time interval. The fractionally spaced equalizer has two advantages over a once per mark spaced equalizer. First, the noise characteristics are better and second, the FSE is able to correct for timing offsets. In addition, by training on a specific sequence at the beginning of a data block, the FSE filter can adapt to differences in individual recorders and players that read and write marks and also to disc/media variations. Also, the FSE filter can adapt to changes that occur over time as an individual player experiences wear. In another embodiment, the FSE, possibly together with the precompensation, undoes the intersymbol interference in the data signal. This is referred to as a zero forcing equalizer. A FSE is described further in Proakis, "Digital Communications," 3rd edition, which is herein incorporated by reference, at pp. 617–620, and also in Lee & Messerschmitt, "Digital Communication," 2nd ed., which is herein incorporated by reference at pp.482,484,544.

Referring back to FIG. 2, the signal output from the FSE is interpreted by a Viterbi detector 234. The Viterbi detector interprets the signal levels and determines the most likely sequence of data based on a metric. It calculates this metric for all combinations of paths and, after some time, chooses the path that was most likely as determined by the path-metric calculation.

The Viterbi detector includes a mark handler that removes the effect of non data marks on the equalized signal output from the FSE. In one embodiment, the Viterbi accomplishes this by periodically ignoring marks in the locations where nondata marks are known to exist.

The output signal from the Viterbi is sent to an error correction code (ECC) decoder. The ECC decoder decodes the data and checks for errors in the data. One such error correction code used in one embodiment is described in U.S. patent application Ser. No. 09/083,699 entitled, Method And Apparatus For Modulation Encoding Data For Storage On A Multi-Level Optical Recording Medium by Welch, et. al which is herein incorporated by reference.

A system for reading multilevel marks including automatic gain control fields and decoding data from those marks has been described. Next, the marks themselves and a system for writing such marks is described. A typical mark pattern generated by such a writing system and read by the read system described above is shown.

In one embodiment, the system disclosed is used to read and write data marks to a disc where each of the data marks are the same length. Constraints are not imposed that require a minimum number of identical data marks to be written consecutively or that define a maximum number of identical data marks that may be placed next to each other. Neither are constraints imposed that require the data marks to periodically return to a certain level, as with a return to zero code. In other embodiments, run length limited codes or return to zero codes may be used. In addition to data marks, system marks are also included periodically in the data stream to facilitate the operation of the modules described above. Sets of marks that together perform a function are referred to as a field. System marks may include timing, AGC, and DC control marks that are periodically inserted into the data stream.

Figure 5A:
FIG. 5A is a block diagram showing a data block format used in one embodiment.
Figure 5B:
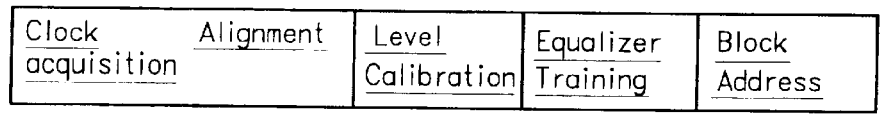
FIG. 5B illustrates a preamble sequence.

FIG. 5A is a block diagram showing a data block format used in one embodiment. The preamble (which is described further in FIG. 5B) contains sections for clock acquisition, level calibration, equalizer training, alignment, block address, and, in some embodiments, may also contain a start of data pattern. The clock acquisition section contains timing and AGC fields with no data in between them so that amplitude modulation can be removed and the clock can be acquired. The level calibration pattern contains long signals at each level to calibrate the system. The alignment sequence is a pseudo random sequence that has a response such that when the alignment sequence is correlated with itself, the correlation has a sharp peak; that is the correlation has a substantially high value at only a location that indicates precise alignment. The equalizer training sequence enables the adjustment of the equalizer to the particular disc and player combination being read. The block address enables the system to uniquely identify the ECC block on the disc. In some embodiments, a start of data pattern sequence identifies the start of the data pattern. In other embodiments, the start of the data pattern is determined by an offset from the alignment block.

Figure 5C:
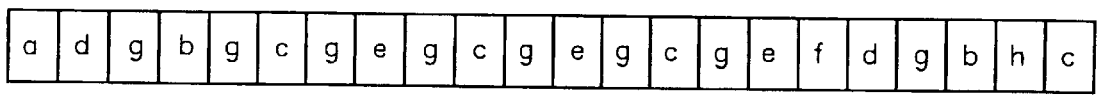
FIG. 5C illustrates an ECC block.

The ECC block includes modulation encoded marks and physical format marks. The modulation encoded marks are encoded by the modulation so that their form is altered by the modulation code and the physical format marks are periodically inserted in the data stream after modulation coding so that their form is not altered by the modulation coding. The ECC block (which is shown in FIG. 5C) contains an encoded address section, periodic ECC-data synch fields, periodic timing fields, periodic AGC fields, periodic DC control fields, encoded data marks, encoded ECC marks, and encoded trellis clean-up marks. The physical format ECC block marks include periodic ECC-data synch fields, periodic timing fields, periodic AGC fields, and periodic DC control fields. The physical format marks plus the modulation encoded marks comprise the ECC block.

The data marks (g) are interspersed between the other format marks or fields (groups of marks). The address section (a) duplicates the address of the ECC block and also contains an error detection code. The ECC-data synch (b) fields provide location information within the ECC block to aid data recovery. As described above, the timing fields (c) are used to recover the clock, and the AGC (d) fields are used to remove the low-frequency drift in the envelope. The DC control (e) fields are used to control the DC content of the signal. The ECC (f) fields contain the error correction bytes that enable locating and correcting errors in the data stream. Finally, the encoded trellis clean-up marks (h) are used to return the trellis coded marks to a known state at periodic points in the ECC block.

Figure 5D:
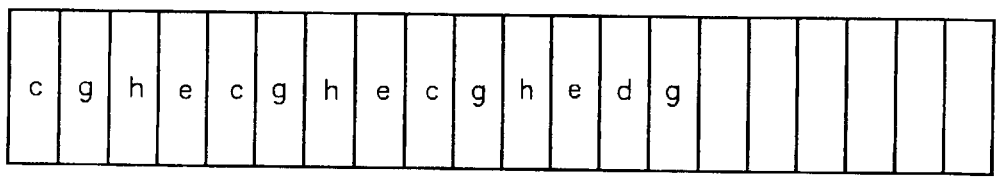
FIG. 5D illustrates a postamble sequence.
Figure 6:
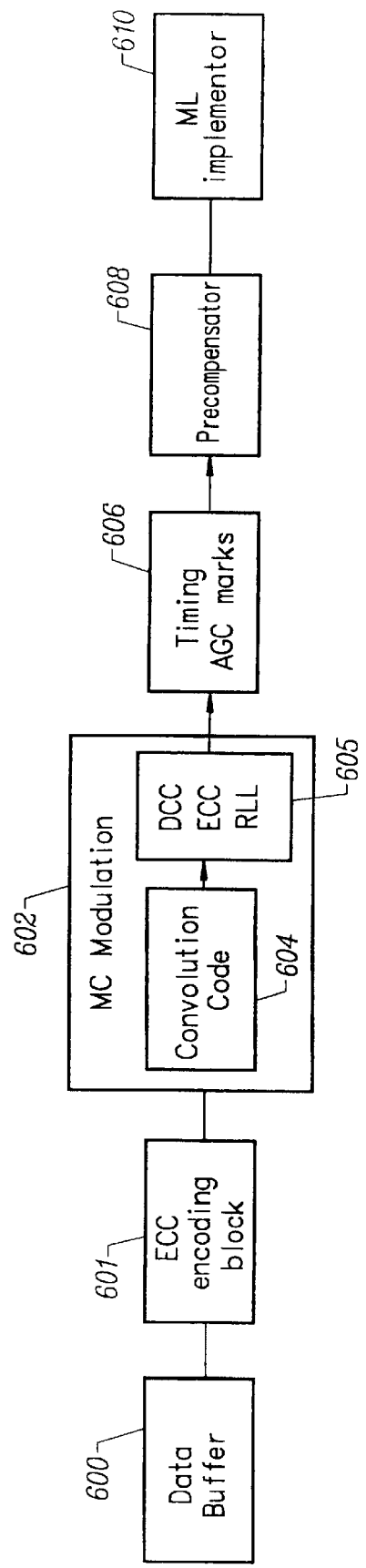
FIG. 6 is a block diagram illustrating a system for writing multilevel marks to a disc.

FIG. 5D illustrates a postamble sequence. The sequence includes timing fields (c), AGC fields (d), filler data marks (g), and DC control fields (e). DC control fields are used to reduce the output DC level of the data block structure. In some embodiments, the postamble may also contain encoded trellis clean-up marks (h) to leave the trellis in a known state. FIG. 6 is a block diagram illustrating a system for writing multilevel marks to a disc. Data from a data buffer 600 is input to an ECC encoding block 601 where ECC check bytes are added to the data stream. This data is then fed to a multilevel modulation block 602. Multilevel modulation block 602 includes a convolution coding block 604 and a mark block 605 that adds the ECC-data synch fields, the DC control fields, and run length limited (RLL) constraints, if such constraints are implemented. Timing and automatic gain control fields such as are described above are added in a block 606. The data stream is then sent to a precompensator 608 and the output of the precompensator is sent to a multilevel implementer 610 that translates the data stream into a bit stream in accordance with the laser write strategy selected for the disc being recorded.

In this embodiment, the ECC encoded data is convolutionally encoded. Convolutional encoding adds correlations between data marks. Both these correlations and correlations due to the optical channel's inherent intersymbol interference can enable more accurate decoding of the data sequence by a maximum likelihood detector, such as a Viterbi detector. In one embodiment, in order to achieve a data rate of 3 bits/mark with M=12 levels, the modulation is 2-dimensional such that 6 bits plus 1 parity bit are encoded into a symbol consisting of two adjacent marks. Since 7 bits require 128 symbols, 16 of the possible 12×12=144 symbols are not be used. The 128-cross modulation constellation is given below. The symbol assignment is found by taking first the row and then the column number for the value to be encoded. For example, the 7-bit value 64 would be encoded as two marks of levels 4 and 7. 999 indicates an invalid symbol.

| 11 | 999 | 999 | 20 | 97 | 16 | 101 | 100 | 17 | 96 | 21 | 999 | 999 |
|----|-----|-----|-----|-----|-----|-----|-----|-----|-----|-----|-----|-----|
| 10 | 999 | 999 | 107 | 110 | 31 | 26 | 27 | 30 | 111 | 106 | 999 | 999 |
| 9  | 12  | 41  | 8   | 45  | 92  | 89  | 88  | 93  | 44  | 9   | 40  | 13  |
| 8  | 35  | 38  | 87  | 2   | 83  | 6   | 7   | 82  | 3   | 86  | 39  | 34  |
| 7  | 48  | 53  | 68  | 113 | 64  | 117 | 116 | 65  | 112 | 69  | 52  | 49  |
| 6  | 127 | 58  | 123 | 62  | 79  | 74  | 75  | 78  | 63  | 122 | 59  | 126 |
| 5  | 124 | 57  | 120 | 61  | 76  | 73  | 72  | 77  | 60  | 121 | 56  | 125 |
| 4  | 51  | 54  | 71  | 114 | 67  | 118 | 119 | 66  | 115 | 70  | 55  | 50  |
| 3  | 32  | 37  | 84  | 1   | 80  | 5   | 4   | 81  | 0   | 85  | 36  | 33  |
| 2  | 15  | 42  | 11  | 46  | 95  | 90  | 91  | 94  | 47  | 10  | 43  | 14  |
| 1  | 999 | 999 | 104 | 109 | 28  | 25  | 24  | 29  | 108 | 105 | 999 | 999 |
| 0  | 999 | 999 | 23  | 98  | 19  | 102 | 103 | 18  | 99  | 22  | 999 | 999 |
|    | 0   | 1   | 2   | 3   | 4   | 5   | 6   | 7   | 8   | 9   | 10  | 11  |

The convolutional encoding is chosen from Table III of "Trellis-Coded Modulation with Redundant Signal Sets, Part 1," Gottfried Ungerboeck, IEEE Communications Magazine, February 1987. The choice is made to balance complexity against coding gain.

Mark Block 605 adds the ECC-data synch patterns which are composed of symbols chosen from the 16 symbols not found in the modulation constellation. One embodiment is given below.

| Sync0:  | 0  | 11 | 11 | 0  | 0  | 11 | 11 | 0  | 0  | 11 |
|---------|----|----|----|----|----|----|----|----|----|----|
| Sync1:  | 11 | 0  | 0  | 11 | 11 | 0  | 0  | 11 | 11 | 0  |
| Sync2:  | 1  | 10 | 10 | 1  | 1  | 10 | 10 | 1  | 1  | 10 |
| Sync3:  | 10 | 1  | 1  | 10 | 10 | 1  | 1  | 10 | 10 | 1  |
| Sync4:  | 10 | 10 | 1  | 1  | 10 | 1  | 11 | 11 | 0  | 0  |
| Sync5:  | 0  | 0  | 11 | 11 | 1  | 10 | 1  | 1  | 10 | 10 |
| Sync6:  | 11 | 11 | 0  | 0  | 10 | 1  | 10 | 10 | 1  | 1  |
| Sync7:  | 1  | 1  | 10 | 10 | 1  | 10 | 0  | 0  | 11 | 11 |
| Sync8:  | 0  | 1  | 11 | 10 | 1  | 0  | 1  | 11 | 10 | 10 |
| Sync9:  | 11 | 0  | 11 | 0  | 11 | 0  | 11 | 0  | 11 | 0  |
| Sync10: | 11 | 10 | 0  | 0  | 1  | 10 | 10 | 1  | 11 | 1  |
| Sync11: | 10 | 1  | 10 | 1  | 10 | 1  | 10 | 1  | 10 | 1  |
| Sync12: | 1  | 10 | 11 | 11 | 0  | 0  | 1  | 10 | 11 | 0  |

Next the DC control fields are added. The DC content of the data signal can be measured using a running digital sum (RDS). In a 12-level system, the each level is assigned a DC content value. For example, level 0, 1, 2, 3, 4, 5, 6, 7, 8, 9, 10, 11 are assigned DC content values $-11, -9, -7, -5, -3, -1, 1, 3, 5, 7, 9, 11$ respectively. RDS is the running sum of the DC content values as the data levels are read. By maintaining the RDS near zero, the average data signal level is near center of the amplitude range of the signal. In one embodiment, the DC control fields signify the inversion or not of the data that is found after one DC control field. For the 12-level modulation code above, inversion would mean that the data mark level k would become data mark level 11-k. In other words, a level 11 would become 0 and a level 3 would become 8. The inversion helps to control the DC content of the data stream. RLL marks can end runs of data at the same level by inserting a mark of a different level at particular locations in the data stream. In one embodiment, the timing, AGC, and DC control fields are frequent enough to act as RLL marks. In other embodiments, separate RLL marks may need to be added.

The marks are then sent on to the precompensator which adjusts the levels desired taking into account the neighboring marks to remove the effects of intersymbol interference or else cause a certain intersymbol interference target to be realized.

If the intersymbol interference is precompensated to a specific target intersymbol interference, the intersymbol interference can be used by the Viterbi detector to better decode the data. The intersymbol interference adds correlations into the data stream so that maximum likelihood detection, as is done when using a Viterbi detector, can better interpret the data signal. Correlations can also be introduced into the data stream explicitly using a convolutional code. In various embodiments, correlations are introduced using several different methods or combinations of such methods. For example, correlations may be introduced by the optical system, can be shaped by using precompensation, can be introduced using a convolutional code, and can be introduced by both ISI and convolutional encoding.

In addition, in certain embodiments, write calibration is included with the multilevel implementer. Write calibration compensates for changes in the writing of marks on the disc due to age or wear as well as variations in disc characteristics. The write calibration procedure has 3 iterative steps:

1) write a known pattern to the disc, 2) read the pattern, 3) adjust the write strategy to ensure that the pattern written causes the pattern that is read to be the desired read pattern. In one embodiment, the read pattern is compared to a linear filtered version of the written pattern. In this embodiment, the adjustments are made so that the non-linear effects of the system are removed or compensated for by calibration. In other embodiments, both the linear and the non-linear effects of the read and write system can be calibrated or compensated for using this method.

This procedure allows the player and disc combination to adjust for changes that may affect the writing and reading of data onto the disc. Factors that might be calibrated out using this procedure include laser age, laser temperature, dust on the lens or disc, and variation of the disc materials.

Finally, the adjusted levels are sent to the multi-level implementer which translates the levels determined using the precompensator and the write calibrator to a series of pulses of specific laser powers of specific durations at specific times.

A system for writing data to a multilevel disc and reading data from the multilevel disc has been disclosed. The read system compensates for noise introduced in the read signal by using an adaptive FSE. In addition, precompensation is performed before a signal is written to the disk. Special fields are written to the disc to facilitate clock recovery and automatic gain compensation. Other fields control the DC bias of the signal read from the disk.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of reading a multilevel signal from an optical disc comprising:

reading an analog data signal from a disc using an optical detector;

preliminarily desnaking the analog data signal using a top and a bottom envelope detector circuit to subtract a first offset and normalize an amplitude of the analog data signal;

recovering a timing signal from the analog data signal;

converting the analog signal to a digital data signal using an analog to digital converter; and correcting for amplitude modulation of the analog data signal by processing the digital data signal to obtain an amplitude adjusted digital data signal.

2. A method of reading a multilevel signal from an optical disc as recited in claim 1 wherein the timing signal is input to the analog to digital converter.

3. A method of reading a multilevel signal from an optical disc as recited in claim 1 wherein the amplitude of the analog data signal is adjusted before the timing signal is recovered.

4. A method of reading a multilevel signal from an optical disc as recited in claim 1 wherein correcting for amplitude modulation of the analog data signal by processing the digital data signal to obtain an amplitude adjusted digital data signal further includes analyzing recovered signal peak values and making adjustments to the digital data signal to correct for detected signal amplitude variation.

5. A method of reading a multilevel signal from an optical disc as recited in claim 1 wherein correcting for amplitude modulation of the analog data signal by processing the digital data signal to obtain an amplitude adjusted digital data signal further includes analyzing recovered signal peak values generated by reading gain control marks.

6. A method of reading a multilevel signal from an optical disc comprising:

reading an analog data signal from a disc using an optical detector;

preliminarily desnaking the analog data signal using a top and a bottom envelope detector circuit to subtract an offset and normalize an amplitude of the analog data signal;

converting the analog signal to a digital data signal using an analog to digital converter; and correcting for amplitude modulation of the analog data signal by processing the digital data signal to obtain an amplitude adjusted digital data signal.

7. A method of reading a multilevel signal from an optical disc as recited in claim 6 wherein correcting for amplitude modulation of the analog data signal by processing the digital data signal to obtain an amplitude adjusted digital data signal further includes analyzing recovered signal peak values generated by reading gain control marks.

8. A method of reading a multilevel signal from an optical disc as recited in claim 6 wherein a timing signal is input to the analog to digital converter.

9. A method of reading a multilevel signal from an optical disc as recited in claim 6 wherein the amplitude of the analog data signal is adjusted before the timing signal is recovered.

10. A method of reading a multilevel signal from an optical disc as recited in claim 6 wherein correcting for amplitude modulation of the analog data signal by processing the digital data signal to obtain an amplitude adjusted digital data signal further includes analyzing recovered signal peak values and making adjustments to the digital data signal to correct for detected signal amplitude variation.

11. An amplitude modulation compensator comprising:

an optical detector configured to read an analog data signal from a disc;

a desnaker using a top and a bottom envelope detector circuit to subtract an offset and normalize an amplitude of the analog data signal;

an analog to digital converter configured to convert the analog signal to a digital data signal; and a digital processor configured to correct for amplitude modulation of the analog data signal by processing the digital data signal to obtain an amplitude adjusted digital data signal.

12. An amplitude modulation compensator as recited in claim 11 wherein the digital processor is configured to correct for amplitude modulation of the analog data signal by processing the digital data signal to obtain an amplitude adjusted digital data signal further includes analyzing recovered signal peak values generated by reading gain control marks.

13. An amplitude modulation compensator as recited in claim 11 the analog to digital converter includes a timing signal input.

14. An amplitude modulation compensator as recited in claim 11 wherein the digital processor is configured to correct for amplitude modulation of the analog data signal by processing the digital data signal to obtain an amplitude adjusted digital data signal further includes analyzing recovered signal peak values and making adjustments to the digital data signal to correct for detected signal amplitude variation.

* * * * *